United States Patent
Yoshino et al.

(10) Patent No.: US 9,870,964 B1
(45) Date of Patent: Jan. 16, 2018

(54) METHOD OF MANUFACTURING SEMICONDUCTOR DEVICE BY DETERMINING AND SELECTING COOLING RECIPE BASED ON TEMPERATURE

(71) Applicant: HITACHI KOKUSAI ELECTRIC INC., Tokyo (JP)

(72) Inventors: Teruo Yoshino, Toyama (JP); Takeshi Yasui, Toyama (JP)

(73) Assignee: HITACHI KOKUSAI ELECTRIC, INC., Tokyo (JP)

( * ) Notice: Subject to any disclaimer, the term of this patent is extended or adjusted under 35 U.S.C. 154(b) by 0 days.

(21) Appl. No.: 15/460,752

(22) Filed: Mar. 16, 2017

(30) Foreign Application Priority Data

Sep. 28, 2016 (JP) ................................. 2016-189640

(51) Int. Cl.
*H01L 21/66* (2006.01)
*H01L 21/687* (2006.01)
*H01L 21/67* (2006.01)
*H01L 21/677* (2006.01)
*H01L 21/02* (2006.01)
*H01L 21/683* (2006.01)

(52) U.S. Cl.
CPC ........ *H01L 22/26* (2013.01); *H01L 21/02164* (2013.01); *H01L 21/67098* (2013.01); *H01L 21/67201* (2013.01); *H01L 21/67745* (2013.01); *H01L 21/6838* (2013.01); *H01L 21/68707* (2013.01)

(58) Field of Classification Search
None
See application file for complete search history.

(56) References Cited

U.S. PATENT DOCUMENTS

2001/0010950 A1* 8/2001 Savage ................... C23C 16/54
438/124
2001/0029112 A1* 10/2001 Toyoda ................. C23C 16/452
438/785

(Continued)

FOREIGN PATENT DOCUMENTS

JP 64-044023 A 2/1989
JP 08-017752 A 1/1996

(Continued)

OTHER PUBLICATIONS

Office Action for Japanese counterpart application 2016-189640 dated Aug. 2, 2017.

*Primary Examiner* — Michelle Mandala
(74) *Attorney, Agent, or Firm* — Volpe and Koenig, P.C.

(57) ABSTRACT

The present disclosure provides a technique including a method of manufacturing a semiconductor device, which is capable of improving a processing uniformity of a plurality of substrates. The method may include: (a) subjecting a substrate accommodated in one of a plurality of process chambers to a thermal process: (b) transferring the substrate processed in (a) by a transfer robot provided in a vacuum transfer chamber connected to the plurality of process chambers from the one of a plurality of process chambers to a loadlock chamber connected to the vacuum transfer chamber; and (c) cooling the substrate accommodated in the loadlock chamber by supplying an inert gas to the substrate accommodated in the loadlock chamber according to a cooling recipe.

10 Claims, 11 Drawing Sheets

| TEMPERATURE OF WAFER | COOLING RECIPE |
|---|---|
| RT | A1 FIRST COOLING RECIPE |
| ~200°C | A2 SECOND COOLING RECIPE |
| ~300°C | A3 THIRD COOLING RECIPE |
| ~400°C | A4 FOURTH COOLING RECIPE |
| ~500°C | A5 FIFTH COOLING RECIPE |

(56) References Cited

U.S. PATENT DOCUMENTS

| | | | |
|---|---|---|---|
| 2002/0034886 A1* | 3/2002 | Kurita | H01L 21/67167 438/800 |
| 2009/0016853 A1* | 1/2009 | Yoo | H01L 21/67201 414/147 |
| 2011/0311339 A1* | 12/2011 | Yasui | H01J 37/32743 414/217 |
| 2016/0314997 A1* | 10/2016 | Reuter | H01L 21/67201 |

FOREIGN PATENT DOCUMENTS

| | | |
|---|---|---|
| JP | 2004-193307 | 7/2004 |
| JP | 2009-200241 | 9/2009 |
| JP | 2011-91373 | 5/2011 |
| JP | 5947435 B1 | 7/2016 |

* cited by examiner

FIG. 10

| TEMPERATURE OF WAFER | COOLING RECIPE |
|---|---|
| RT | A1 FIRST COOLING RECIPE |
| ~200°C | A2 SECOND COOLING RECIPE |
| ~300°C | A3 THIRD COOLING RECIPE |
| ~400°C | A4 FOURTH COOLING RECIPE |
| ~500°C | A5 FIFTH COOLING RECIPE |

FIG. 11

| COOLING RECIPE | SWAP & TRANSFER | | FLOW RATE OF INERT GAS [ARBITRARY UNIT] | | FLOW RATE OF COOLANT [ARBITRARY UNIT] | |
|---|---|---|---|---|---|---|
| FIRST COOLING RECIPE | b1 | N・Y | c1 | - | z1 | - |
| SECOND COOLING RECIPE | b2 | Y | c2 | 30 | z2 | 1 |
| | b3 | N | c3 | 50 | z3 | 1 |
| THIRD COOLING RECIPE | b4 | Y | c4 | 50 | z4 | 1.5 |
| | b5 | N | c5 | 60 | z5 | 2 |
| FOURTH COOLING RECIPE | b6 | Y | c6 | 70 | z6 | 2.5 |
| | b7 | N | c7 | 80 | z7 | 4 |
| FIFTH COOLING RECIPE | b8 | Y | c8 | 90 | z8 | 4.5 |
| | b9 | N | c9 | 100 | z9 | 6 |

METHOD OF MANUFACTURING SEMICONDUCTOR DEVICE BY DETERMINING AND SELECTING COOLING RECIPE BASED ON TEMPERATURE

CROSS-REFERENCE TO RELATED PATENT APPLICATION

This non-provisional U.S. patent application claims priority under 35 U.S.C. § 119 of Japanese Patent Application No. 2016-189640, filed on Sep. 28, 2016, the entire contents of which are hereby incorporated by reference.

BACKGROUND

1. Field

The present disclosure relates to a method of manufacturing a semiconductor device.

2. Description of the Related Art

The process of fabricating a semiconductor device may include, for example, forming an oxide film containing a predetermined element such as silicon on a substrate. The process of forming the oxide film including the predetermined element may be performed by a substrate processing apparatus including, for example, a plurality of process chambers.

It is necessary to improve the uniformity of processing of a plurality of substrates performed by a substrate processing apparatus.

SUMMARY

Described herein is a technique for improving the uniformity of processing of a plurality of substrates.

According to one aspect, a technique is provided that includes method of manufacturing a semiconductor device. The method may include: (a) subjecting a substrate accommodated in one of a plurality of process chambers to a thermal process; (b) transferring the substrate processed in (a) by a transfer robot provided in a vacuum transfer chamber connected to the plurality of process chambers from the one of a plurality of process chambers to a loadlock chamber connected to the vacuum transfer chamber; and (c) cooling the substrate accommodated in the loadlock chamber by supplying an inert gas to the substrate accommodated in the loadlock chamber according to a cooling recipe.

BRIEF DESCRIPTION OF THE DRAWINGS

FIG. 10 illustrates a table of cooling steps according to temperatures of a substrate according to the embodiment.

FIG. 11 illustrates a modified example of the cooling step according to the temperature of the substrate according to the embodiment.

DETAILED DESCRIPTION

Figure 1:
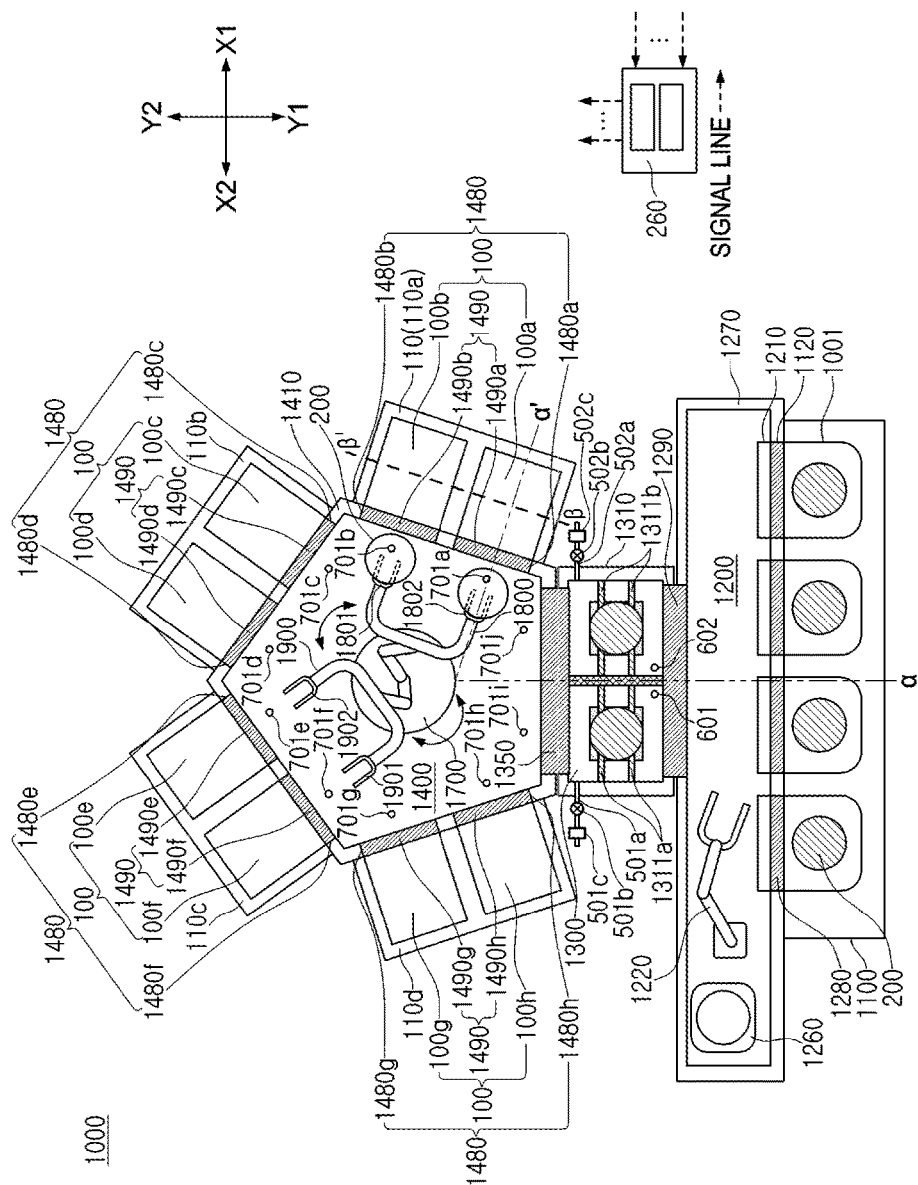
FIG. 1 schematically illustrates a horizontal cross-section of a substrate processing system according to an embodiment described herein.
Figure 2:
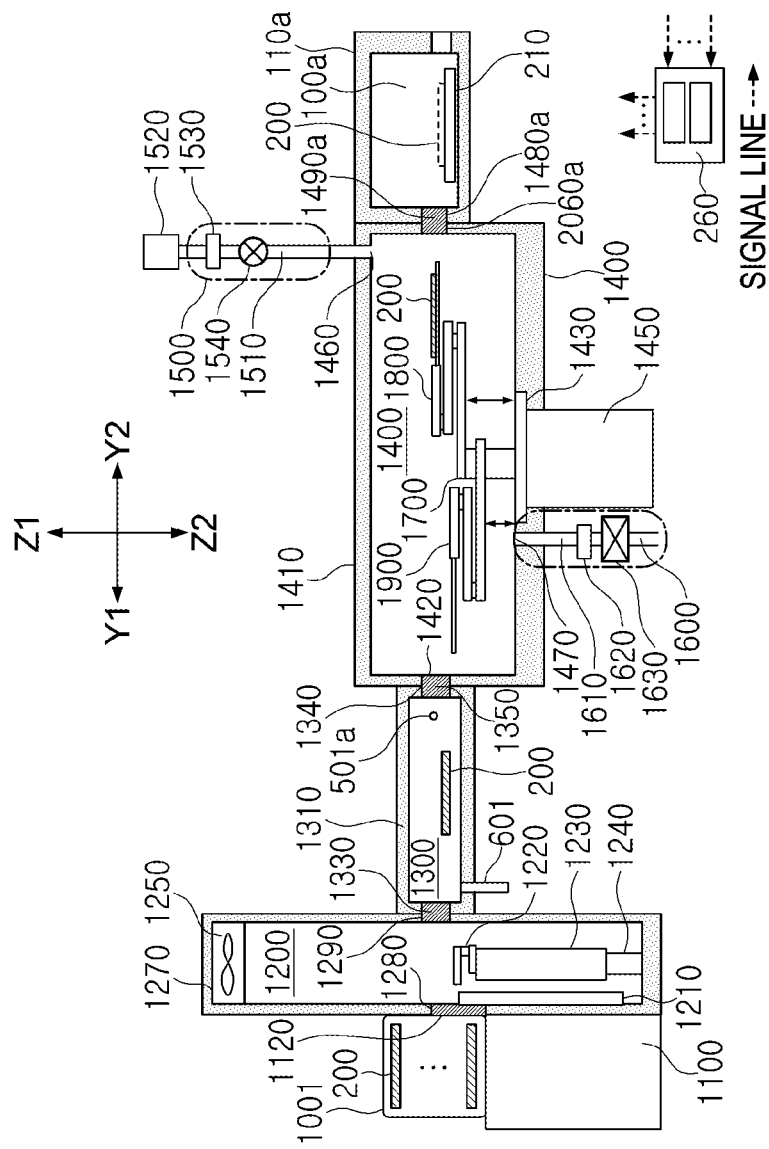
FIG. 2 schematically illustrates a vertical cross-section of a substrate processing system according to the embodiment.
Figure 4:
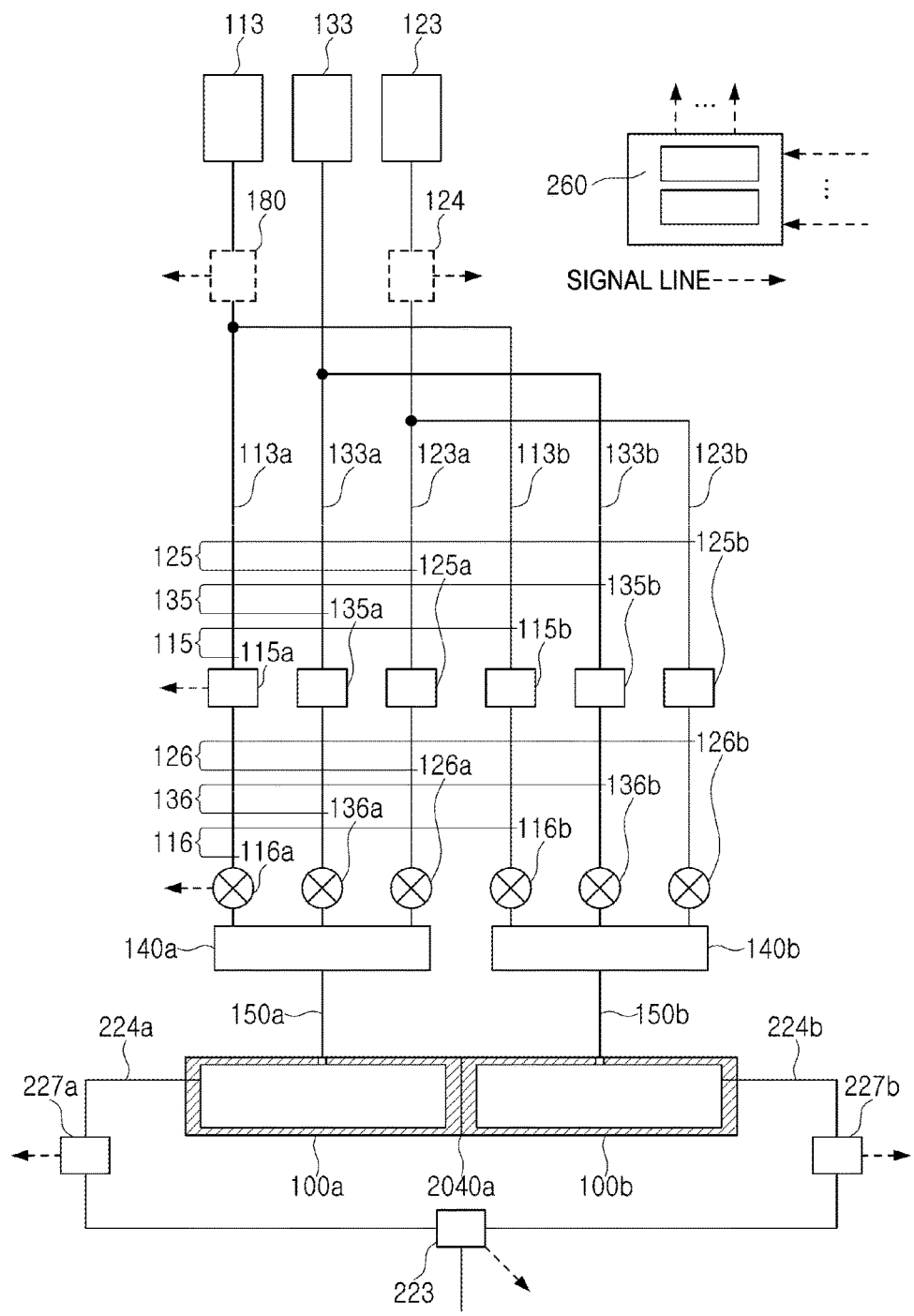
FIG. 4 schematically illustrates a gas supply part and a gas exhaust part of a processing module according to the embodiment.

Hereinafter, an embodiment will be described.
<Embodiment>
(1) Configuration of Substrate Processing System A configuration of the substrate processing system according to the embodiment is described with reference to FIG 1, FIG. 2 and FIG. 4. FIG. 1 is a diagram illustrating the configuration of the substrate processing system according to an embodiment wherein a horizontal cross-section of the substrate processing system is schematically illustrated. FIG. 2 is a diagram illustrating the configuration of the substrate processing system according to the embodiment wherein a vertical cross-section of the substrate processing system taken along the line α-α' in FIG. 1, is schematically illustrated. FIG. 4 is a diagram illustrating a vertical cross-section of the substrate processing system taken along β-β' in FIG. 1 wherein a gas supply part and an exhaust part provided in the processing module are illustrated.

A substrate processing system 1000 according to the embodiment processes a wafer 200. Referring to FIG. 1 and FIG. 2, the substrate processing system 1000 includes an IO stage 1100, a transfer chamber 1200, a loadlock chamber 1300, a vacuum transfer chamber (transfer module: TM) 1400 and processing modules (PM) 110*a*, 110*b*, 110*c* and 110*d*. Hereinafter, each component will be described in detail. In FIG. 1, front, rear, left and right directions are indicated by arrow $X_1$, arrow $X_2$, arrow $Y_1$ and arrow $Y_2$ shown in FIG. 1, respectively.

<Atmospheric Transfer Chamber and IO Stage>

The IO stage 1100 (loading port shelf) is installed at the front side of the substrate processing system 1000. A plurality of pods 1001 are placed on the IO stage 1100. The pod 1001 is used as a carrier for transferring the wafer 200 such as a silicon (Si) substrate. Unprocessed wafers 200 or processed wafers 200 are horizontally stored in each pod 1001.

A cap 1120 is installed at the pod 1001 and is opened and closed by a pod opener (PO) 1210. The pod opener 1210 opens or closes the cap 1120 of the pod 1001 placed on the IO stage 1100 to open or close a substrate entrance. When the pod opener 1210 opens the substrate entrance, the wafer 200 may be loaded into or unloaded from the pod 1001. The pod 1001 is loaded onto the IO stage 1100 and unloaded from the IO stage 1100 by an in-process conveyance device (not shown) (Rail Guided Vehicle, RGV).

The IO stage 1100 is installed adjacent to the atmospheric transfer chamber 1200. The loadlock chamber 1300, which will be described later, is connected to a side of the atmospheric transfer chamber 1200 other than the side to which the IO stage 1100 is provided.

An atmospheric transfer robot 1220, which is a first transfer robot configured to transfer the wafer 200, is provided in the atmospheric transfer chamber 1200. As shown in FIG. 2, the atmospheric transfer robot 1220 is elevated by an elevator 1230 provided in the atmospheric transfer chamber 1200 and is reciprocated laterally by a linear actuator 1240.

As shown in FIG. 2, a clean unit 1250 configured to supply clean air is installed on the upper portion of the atmospheric transfer chamber 1200. As shown in FIG. 1, a device 1260 (hereinafter referred to as a pre-aligner) configured to match a notch or orientation flat of the wafer 200 is installed at the left side of the atmospheric transfer chamber 1200.

As shown in FIG. 1 and FIG. 2, a substrate loading/unloading port 1280 and the PO 1210 for transferring the wafer 200 into or out of the atmospheric transfer chamber 1200 is provided at the front side of a housing 1270 of the atmospheric transfer chamber 1200. The IO stage 1100 is installed at the PO 1210 with the substrate loading unloading port 1280 therebetween. That is, the IO stage 1100 is installed outside the housing 1270.

A substrate loading/unloading port 1290 is installed at the rear side of the housing 1270 of the atmospheric transfer chamber 1200. The wafer 200 is transferred into or out of the loadlock chamber 1300 via the substrate loading/unloading port 1290. The substrate loading/unloading port 1290 is opened or closed by a gate valve 1330. When the substrate loading/unloading port 1290 is opened, the wafer 200 may be loaded into the loadlock chamber 1300 or unloaded from the loadlock chamber 1300.

<Loadlock Chamber>

Figure 3:
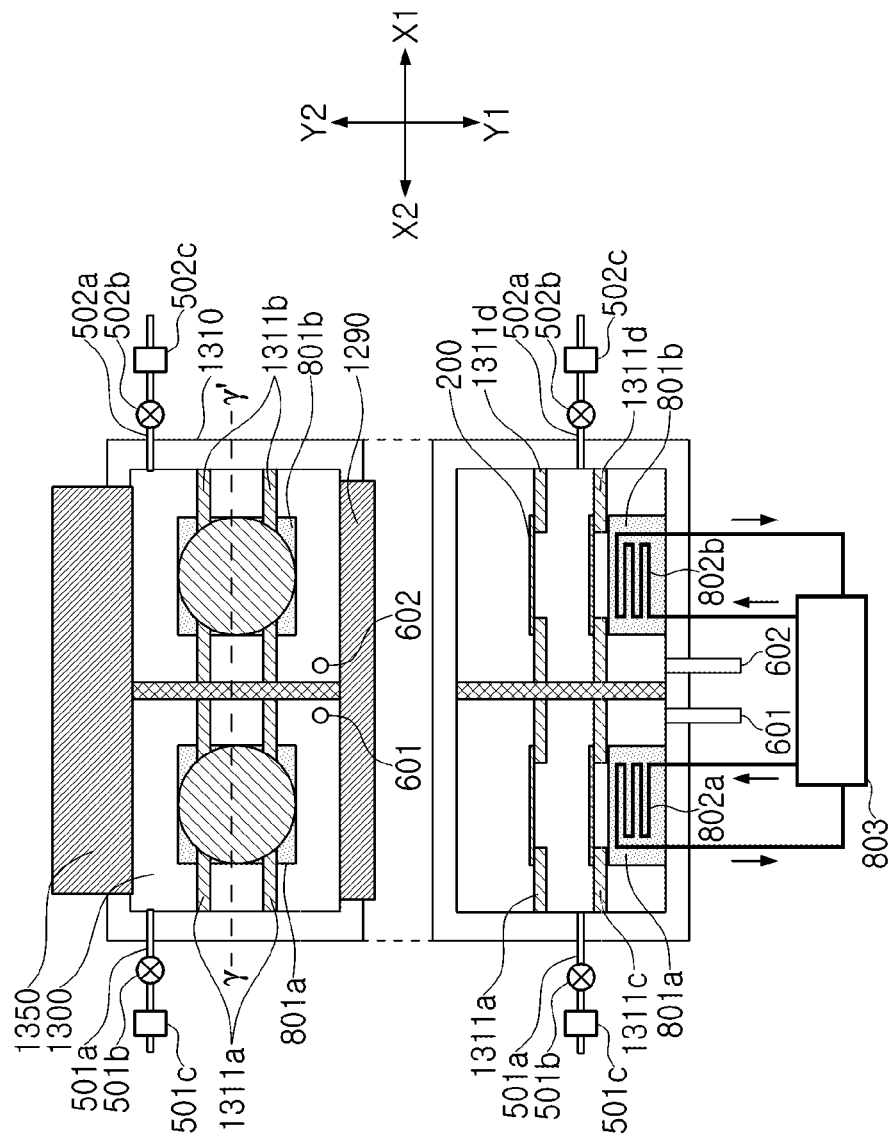
FIG. 3 schematically illustrates a cross-section of a loadlock chamber according to the embodiment.

Next, the loadlock chamber 1300 will be described with reference to FIG. 1, FIG. 2 and FIG. 3. The cross-section taken along the upper γ-γ' line shown in upper half of FIG. 3 is shown in the lower half of FIG. 3. The loadlock chamber 1300 is installed adjacent to the atmospheric transfer chamber 1200. The TM 1400 is provided at a side of the housing 1310 constituting the loadlock chamber 1300 other than the side of the housing 1310 that is in contact with the atmospheric transfer chamber 1200. Since an inner pressure of the housing 1310 is adjusted to be equal to an inner pressure of the atmospheric transfer chamber 1200 or an inner pressure of the TM 1400, the structure of the loadlock chamber 1300 is capable of withstanding negative pressure.

A substrate loading/unloading port 1340 is provided on the side of the housing 1310 that is in contact with the TM 1400. The substrate loading-unloading port 1340 is opened or closed by a gate valve (GV) 1350. The wafer 200 is loaded into or unloaded from the TM 1400 via the substrate loading/unloading port 1340.

Support pans 1311a, 1311b, 1311c and 1311d on which the wafer 200 is placed are provided in the loadlock chamber 1300. Unprocessed wafers 200 are placed on the first support parts 1311a and 1311b of the support pans 1311a, 1311b, 1311c and 1311d. Processed wafers 200 are placed in the second support pans 1311c and 1311d of the support parts 1311a, 1311b, 1311c and 1311d.

An inert gas supply part for supplying an inert gas, which is a cooling gas, into the loadlock chamber 1300, and exhaust parts 601 and 602 for exhausting the inner atmosphere of the loadlock chamber 1300 are provided in the loadlock chamber 1300. The inert gas supply part includes gas supply pipes 501a and 502a, valves 501b and 502b and MFCs 501c and 502c. The inert gas supply part may adjust a flow rate of the cooling gas supplied into the loadlock chamber 1300.

Cooling parts 801a and 801b are disposed below the second support parts 1311c and 1311d to face the wafer 200. The diameters of the surfaces of the cooling parts 801a and 801b facing the wafer 200 are at least greater than the diameter of the wafer 200. Cooling channels 802a and 802b are provided in the cooling parts 801a and 801b. The coolant is supplied from a chiller 803. The coolant used in the embodiment includes a material such as water ($H_2O$) and perfluoropolyether (PFPE).

<Vacuum Transfer Chamber>

The substrate processing system 1000 includes a transfer space, i.e., a transfer chamber TM 1400, in which the wafer 200 is transported under negative pressure. A housing 1410 constituting the TM 1400 is pentagonal when viewed from above. The loadlock chamber 1300 and processing modules (PM) 110a, 110b, 110c and 110d where the wafer 200 is processed are connected to respective sides of the pentagonal housing 1410. A vacuum transfer robot 1700 which is a second transfer robot for transferring the wafer 200 under negative pressure is provided at approximately the center of the TM 1400 with a flange 1430 as a base. While pentagonal TM 1400 is exemplified in FIG. 1, the TM 1400 may be polygonal such as tetragonal and hexagonal.

A substrate loading/unloading port 1420 is provided in a sidewall of the sidewalls of the housing 1410 adjacent to the loadlock chamber 1300. The substrate loading/unloading port 1420 is opened or closed by a gate valve (GV) 1350. The wafer 200 is loaded into or unloaded from the TM 1400 via the substrate loading/unloading port 1420.

As shown in FIG. 2, the vacuum transfer robot 1700 is provided in the TM 1400 and may be lifted and lowered by an elevator 1450 and the flange 1430 while maintaining the TM 1400 airtight. The detailed configuration of the vacuum transfer robot 1700 will be described later. The elevator 1450 may independently elevate two arms 1800 and 1900 provided at the vacuum transfer robot 1700. Tweezers 1801 and 1802 are installed on the arm 1800 and tweezers 1901 and 1902 are installed on the arm 1900. The tweezers 1801 and 1802 may transfer two wafers 200 simultaneously and the tweezers 1901 and 1902 may transfer two wafers 200 simultaneously.

An inert gas supply port 1460 is provided on the ceiling of the housing 1410 to supply the inert gas into the housing 1410. An inert gas supply pipe 1510 is connected to the inert gas supply port 1460. An inert gas source 1520, a mass flow controller 1530 and a valve 1540 are installed at the inert gas supply pipe 1510 in order from the upstream side to the downstream side of the inert gas supply pipe 1510. The mass flow controller (MFC) 1530 may control the amount of the inert gas supplied into the housing 1410.

An inert gas supply part 1500 of the TM 1400 includes the inert gas supply pipe 1510, the MFC 1530, and the valve 1540. The inert gas supply part 1500 may further include the inert gas source 1520 and the inert gas supply port 1460.

An exhaust port 1470 is provided at the bottom of the housing 1410 to exhaust the inner atmosphere of the housing 1410. An exhaust pipe 1610 is installed at the exhaust port 1470. An automatic pressure controller (APC) 1620, which is a pressure controller, and a pump 1630 are installed at the exhaust pipe 1610 in order from the upstream side to the downstream side of the exhaust pipe 1610.

A gas exhaust part 1600 of the TM 1400 includes the exhaust pipe 1610 and the APC 1620. The gas exhaust part 1600 may further include the pump 1630 and the exhaust port 1470.

The inner atmosphere of the TM 1400 is co-controlled by the inert gas supply part 1500 and the gas exhaust part 1600. For example, the inner pressure of the housing 1410 is co-controlled by the inert gas supply part 1500 and the gas exhaust part 1600.

As shown in FIG. 1, the PMs 110a, 110b, 110c and 110d that perform the desired processing on the wafer 200 are provided at four sides among the five sides of the housing 1410 other than the side where the loadlock chamber 1300 is provided.

A chamber 100, which is one of the components of the substrate processing apparatus, is provided in each of the PMs 110a, 110b, 110c and 110d. Specifically, chambers 100a and 100b are provided in the PM 110a. Chambers 100c and 100d are provided in the PM 110b. Chambers 100e and 100f are provided in the PM 110c. Chambers 100g and 100h are provided in the PM 110d.

A substrate loading unloading port 1480 is provided in a sidewall of the sidewalls of the housing 1410 facing each of the chambers 100a, 100b, 100c, 100d, 100e, 100f, 100g and 100h. As shown in FIG. 1 and FIG. 2, a substrate loading/unloading port 1480a is provided in a sidewall of the housing 1410 facing the chamber 100a. Similarly, a substrate loading/unloading port 1480b is provided in a sidewall of the housing 1410 facing to the chamber 100b, a substrate loading/unloading port 1480c is provided in a sidewall of the housing 1410 facing to the chamber 100c, a substrate loading/unloading port 1480d is provided in a sidewall of the housing 1410 facing to the chamber 100d, a substrate loading/unloading port 1480e is provided in a sidewall of the housing 1410 facing to the chamber 100e, a substrate loading/un loading port 1480f is provided in a sidewall of the housing 1410 facing to the chamber 100f, a substrate loading/unloading port 1480g is provided in a sidewall of the housing 1410 facing to the chamber 100g, and a substrate loading/unloading port 1480h is provided in a sidewall of the housing 1410 facing to the chamber 100h. Hereinafter, one of the substrate loading/unloading ports 1480a through 1480h may be referred to as "substrate loading/un loading port 1480" or all of the substrate loading/unloading ports 1480a through 1480h may be collectively referred to as "substrate loading/unloading port 1480."

As shown in FIG. 1, the gate valve (GV) 1490 is installed to correspond to the chambers 100a, 100b, 100c, 100d, 100e, 100f, 100g and 100h. Specifically, the GV 1490a is provided between the chamber 100a and the TM 1400, and the GV 1490b is provided between the chamber 100b and the TM 1400. The GV 1490c is provided between the chamber 100c and the TM 1400, and the GV 1490d is provided between the chamber 100d and the TM 1400. The GV 1490e is provided between the chamber 100e and the TM 1400, and the GV 1490f is provided between the chamber 100f and the TM 1400. A GV 1490g is provided between the chamber 100g and the TM 1400, and a GV 1490h is provided between the chamber 100h and the TM 1400. Hereinafter, one of the gate valves 1490a through 1490h may be referred to as gate valves 1490 or all of the gate valves 1490a through 1490k may be collectively referred to as gate valves 1490.

The substrate loading/unloading port 1480 is opened or closed by the GV 1490. That is, the substrate loading/unloading ports 1480a, 1480b, 1480c, 1480d, 1480e, 1480f, 1480g and 1480h are opened or closed by GVs 1490a, 1490b, 1490c, 1490d, 1490e, 1490f, 1490g and 1490h, respectively. The wafer 200 is transferred into or out of the chambers 100a, 100b, 100c, 100d, 100e, 100f, 100g and 100h through the substrate loading/unloading ports 1480a, 1480b, 1480c, 1480d, 1480e, 1480f, 1480g, respectively.

Temperature sensors 701a, 701b, 701c, 701d, 701e, 701f, 701g, 701h, 701i and 701j for measuring the temperature of the wafer 200 are provided at the front side of the GVs 1490a, 1490b, 1490c, 1490d, 1490e, 1490f, 1490g, 1490h and 1350, respectively. Each of the temperature sensors 701a, 701b, 701c, 701d, 701e, 701f, 701g, 701h, 701i and 701j includes, for example, a radiation thermometer. The temperature of the wafer 200 during transportation may he measured by the temperature sensors 701a, 701b, 701c, 701d, 701e, 701f, 701g, 701h, 701i and 701j.

<Processing Module (PM)>

Next, the PM 110a among the PMs 110a, 110b, 110c and 110d will be described with reference to FIG. 1, FIG. 2 and FIG. 4. FIG. 4 illustrates a gas supply part and a gas exhaust part connected to the PM 110a.

Since the PMs 110b, 110c and 110d are the same as the PM 110a, only the PM 110a among she PMs 110a, 110b, 110c and 110d is described, and the descriptions of the PMs 110b, 110c and 110d are omitted.

As shown in FIG. 4, the chamber 100a and the chamber 100b, which are part of the substrate processing apparatus for processing the wafer 200, are provided in t PM 110a. A partition wall 2040a is installed between the chamber 100a and the chamber 100b. The partition wall 2040a prevents the inner atmosphere of the chamber 100a from being mixed with the inner atmosphere of the chamber 100b.

As shown in FIG. 2, a substrate loading/unloading port 2060a is provided in the sidewall of the TM 1400 adjacent to the chamber 100a. Similarly, substrate loading/unloading ports (not shown) are provided in the sidewalls of the TM 1400 adjacent to the chambers 100b, 100c, 100d, 100e, 100f, 100g and 100h, respectively.

A substrate support 210 supporting the wafer 200 is installed in the chamber 100a.

The gas supply part supplying the process gas into the chamber 100a and the chamber 100b is connected to the PM 110a. The gas supply part includes components such as a first gas supply part, a second gas supply part and a third gas supply part. The configuration of each gas supply part is described below.

The gas exhaust part for exhausting the chamber 100a and the chamber 100b is connected to the PM 110a. As shown in FIG. 4, one gas exhaust part can exhaust multiple chambers including the chambers 100a and 100b.

Thus, a plurality of chambers including the chambers 100a and 100b provided in the PM 110a may share the gas supply part and the gas exhaust part.

Different processes performed in different temperature ranges may be performed in the PMs 100a, 100b, 100c and 100d. Low temperature processing (at a first temperature) may be performed in the PMs 100a and 100b and high temperature processing (at a second temperature higher than the first temperature) may be performed in the PMs 100c and 100d. In such case, the following problems may occur. Due to the following problems, the thermal history between the wafers 200 may be different from each other. Therefore, the uniformity of the processing between wafers (substrate) 200 may be degraded.

(a) The temperatures of the wafers 200 unloaded from the PMs 100a and 100b are different from the temperatures of the wafers 200 unloaded from the PMs 100c and 100d. Thus, the time necessary for cooling the wafers 200 in the loadlock chamber 1300 is not the same. As a result, there is a problem that a delay may occur in a sequence for transferring a substrate, that is, in a transfer sequence.

(b) The time taken for the processed wafer 200 to be transported from the PMs 100a and 100b to the loadlock chamber 1300 may differ from the time taken to transport the processed wafer 200 from the PMs 100c and 100d to the loadlock chamber 1300. When the temperatures of the wafers 200 transferred from the PMs 100a and 100b and the PMs 1100c and 100d to the loadlock chamber 1300 differ from each other, the cooling times of the wafers 200 in the loadlock chamber 1300 differ from each other (i.e., not uniform), resulting in the delay in the transfer sequence. For example, the temperature of the processed wafer 200 transferred to the loadlock chamber 1300 after unloading by swap & transfer process described later differs from the temperature of the processed wafer 200 transferred to the loadlock chamber 1300 after unloading by pick & transfer process described later. When the processed wafer 200 is unloaded by the swap & transfer process, the wafer 200 is in standby in the TM 1400 until the swap & transfer process is completed. Therefore, the temperature of the wafer 200 unloaded by the swap & transfer process is lower than the temperature of the wafer 200 unloaded by the pick & transfer process.

(c) The temperature difference between two wafers 200 may be generated when the two wafers 200 are unloaded after only one wafer 200 is unloaded by one of the two arms 1800 and 1900 of the vacuum transfer robot 1700. The difference in the temperatures of the tweezers 1801 and 1802 is generated when the wafers 200 are unloaded only by the tweezers 1801 not by the tweezers 1802 of the arm 1800. Accordingly, the temperatures of the two wafers 200 transferred by the tweezers 1801 and 1802 thereafter are affected by the temperatures of the tweezers 1801 and 1802.

Next, the substrate processing apparatus according to the embodiment will be described.

Figure 5:
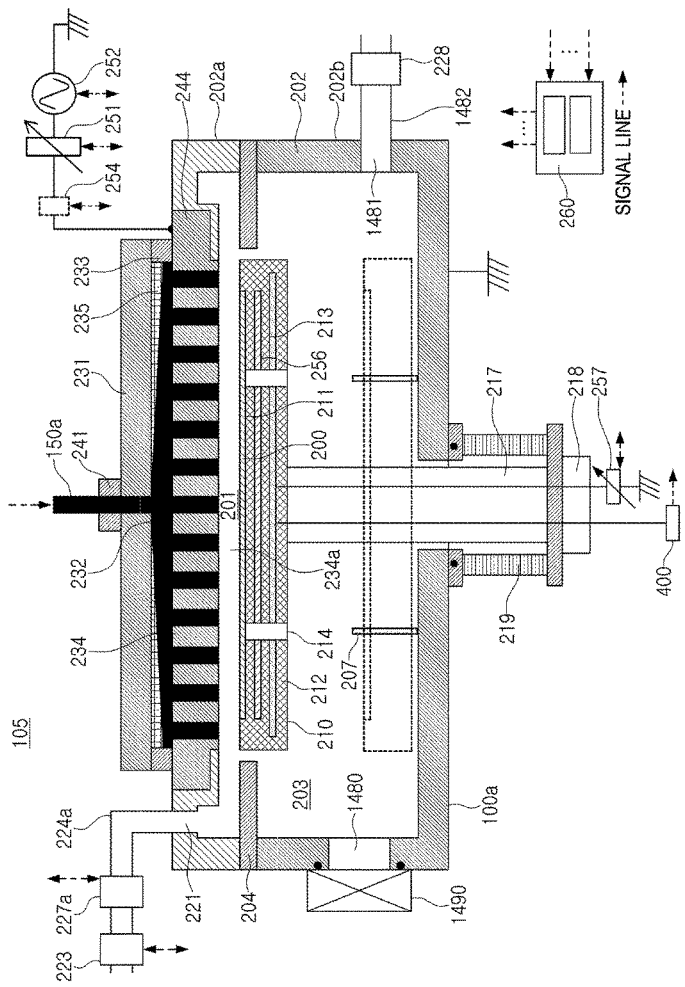
FIG. 5 schematically illustrates a substrate processing apparatus according to the embodiment.

(2) A substrate processing apparatus 105 includes, for example, an insulating film forming unit. The substrate processing apparatus 105 may include a plurality of chambers 100. In FIG. 5, only the chamber 100a, for example, of the substrate processing apparatus 105 is shown. The substrate processing apparatus 105 includes, for example, a single wafer type substrate processing apparatus. Referring to FIG. 5, a case where the substrate processing apparatus 105 includes the chamber 100a will be described. The descriptions of the cases where the substrate processing apparatus 105 includes the chambers 100a and 100b, where the substrate processing apparatus 105 includes the chambers 100c and 100d, and where the case where the substrate processing apparatus 105 includes the chambers 100a and 100h is omitted.

As shown in FIG. 5, the substrate processing apparatus 105 includes a process vessel 202 defining the chamber 100a. The process vessel 202 includes, for example, a flat, sealed vessel having a circular horizontal cross-section. The process vessel 202 is made of a metal material such as aluminum (Al) and stainless steel (SUS) or quartz. A process chamber 201 and a transfer chamber 203 for processing the wafer 200 such as a silicon wafer (substrate) are provided in the process vessel 202. The process vessel 202 includes an upper vessel 202a and a lower vessel 202b. A boundary portion 204 is installed between the upper vessel 202a and the lower vessel 202b. A space above the boundary portion 204 surrounded by the upper process vessel 202a is referred to as the process chamber 201. A space below the boundary portion 204 surrounded by the lower vessel 202b, that is, a space in the vicinity of the gate valve 1490, is referred to as the transfer chamber 203.

The substrate loading/unloading port 1480 is installed adjacent to the gate valve 1490 in the sidewall of the lower vessel 202b. The wafer 200 is transported between the TM 1400 and the transfer chamber 203 via the substrate loading, unloading port 1480. Lift pins 207 are installed at the bottom of the lower vessel 202b. The lower vessel 202b is electrically grounded.

The substrate support 210 supports the wafer 200 and is provided in the process chamber 201. The substrate support 210 includes a support 212 having a surface on which the wafer 200 is placed and a heater 213 serving as a heating part. Through-holes 214 the lift pins 207 penetrate are provided at positions of the substrate support 212 corresponding to the lift pins 207. A bias electrode 256 for applying a bias to the wafer 200 or process chamber 201 may be installed in the substrate support 212. A temperature measuring unit 400 is connected to the heater 213. The temperature measuring unit 400 may measure the temperature of the heater 213 and transmit the measured temperature to a controller 260. The bias electrode 256 is connected to a bias adjusting unit 257. The bias adjusting unit 257 is capable of adjusting the bias. The bias adjusting unit 257 may transmit or receive the setting information thereof to or from the controller 260.

The substrate support 212 is supported by a shaft 217. The shaft 217 penetrates the bottom of the process vessel 202. The shaft 217 is connected to an elevating mechanism 218 outside the process vessel 202. The wafer 200 placed on the substrate placing surface 213 is lifted and lowered by operating the elevating mechanism 218 to lift and lower the shaft 217 and the substrate support 212. Bellows 219 covers the periphery of the lower end of the shaft 217. The interior of the process chamber 201 is maintained airtight.

When the wafer 200 is processed, the substrate support 212 is moved to a wafer processing position indicated by the solid line in FIG. 5. When the wafer 200 is transported, the substrate support 212 moves to a wafer transfer position indicated by the dashed line in FIG. 5. The wafer transfer position is the position of the upper end portion of the lift pin 207 protruding from the upper surface of the substrate placing surface 211.

Specifically, when the substrate support 212 is lowered to the wafer transfer position, me upper end portion of the lift pins 207 protrudes from the upper surface of the substrate placing surface 211 and supports the wafer 20 from thereunder. When the substrate support 212 is elevated to the wafer processing position, the lift pins 207 are buried from the upper surface of the substrate placing surface 211 and the substrate placing surface 211 supports the wafer 200 from thereunder. Since the lift pins 207 are in direct contact with the wafer 200, the lift pins 207 are preferably made of a material such as quartz and alumina.

<Exhaust Part>

A first exhaust port 221 is provided on the inner wall surface of the process chamber 201 (the upper vessel 202a) to exhaust an inner atmosphere of the process chamber 201. An exhaust pipe 224a is connected to the first exhaust port 221. A pressure controller 227a such as an APC and a vacuum pump 223 for controlling the inner pressure of the process chamber 201 to a predetermined pressure are connected in series to the exhaust pipe 224a in order. A first exhaust part (exhaust line) includes the first exhaust port 221, the exhaust pipe 224a and the pressure controller 227a. The first exhaust part (exhaust line) may further include the vacuum pump 223. A second exhaust port 1481 is installed on the inner wall surface of the transfer chamber 203 to exhaust an inner atmosphere of the transfer chamber 203. A pressure controller 228 is installed at the exhaust pipe 1482 and adjusts the inner pressure of the transfer chamber 203 to a predetermined pressure. The inner atmosphere of the process chamber 201 may be exhausted through the transfer chamber 205 and the second exhaust port 1481. The pressure controller 227a may transmit or receive information, such as pressure and opening degree of the valve to or from the controller 260. The vacuum pump 223 may transmit or receive information such as ON/OFF and load of the pump to or from the controller 260.

<Gas Introduction Port>

A gas introduction port 241 for supplying various gases to the process chamber 201 is installed on the ceiling surface of a shower head 234 provided in the process chamber 201. The configuration of each gas supply part connected to the gas introduction port 241 will be described later.

<Gas Dispersion Unit>

The shower head 234, which is a gas dispersion unit, includes a buffer chamber 232 and an electrode 244 which is an activation unit. Dispense holes 234a are provided in the electrode 244 for dispersing gas to the wafer 200. The shower head 234 is installed between the gas introduction port 241 and the process chamber 201. The gas introduced through the gas introduction port 241 is supplied to the buffer chamber 232 of the shower head 234 and then supplied to the process chamber 201 through the dispersion holes 234a.

The electrode 244 may be made of a conductive metal. The electrode 244 is part of an activation unit (excitation unit) for exciting the gas. An electromagnetic wave (high frequency wave or microwave) may be supplied to the electrode 244. A cover 231 may be made of a conductive member. An insulating block 233 is provided between the cover 231 and the electrode 244 to insulate the covet 231 from the electrode 244.

A gas guide 235 may be provided in the buffer chamber 232. The gas guide 235 has a conic shape having a diameter getting larger along the radial direction of the wafer 200 around the gas introduction port 241. The lower end of the gas guide 235 extends further outward than the end portion of the region where the dispersion holes 234a are provided. The gas guide 235 enables a uniform supply of the gas to the dispersion holes 234a. Thus, the amount of active species supplied to the surface of the wafer 200 may be uniform.

<Activation Unit (Plasma Generating Unit)>

A matching unit 251 and a high frequency power supply unit 252 axe connected to and supply an electromagnetic wave (high frequency wave or microwave) to the electrode 244 which is the activation unit. The gas supplied into the process chamber 201 may be activated by the activation unit. The electrode 244 is configured to produce a capacitively-coupled plasma. Specifically, the electrode 244 is in the form of a conductive plate and is supported by the upper vessel 202a. The activation unit includes at least the electrode 244, the matching unit 251 and the high frequency power supply unit 252. The activation unit may further include an impedance meter 254. The impedance meter 254 may be provided between the electrode 244 and the high frequency power supply unit 252. The matching unit 251 and the high frequency power supply unit 252 may be feedback-controlled based on the impedance measured by the impedance meter 254. The high frequency power supply unit 252 may transmit or receive power setting information to or from the controller 260. The matching unit 251 may transmit or receive the matching information (traveling wave data, reflected wave data) to or from the controller 260. The impedance meter 254 may transmit or receive impedance information to or from the controller 260.

<Gas Supply Part>

A gas supply pipe 150a is connected to the gas introduction port (denoted by reference numeral 241 in FIG. 5) of the chamber 100a. Similarly, a gas supply pipe 150b is connected to the gas introduction port (not shown) of the chamber 100b. Similarly, gas supply pipes (not shown) are connected to the gas introduction pons (not shown) of the chambers 100c through 100h. A first gas, a second gas and a purge gas described later are supplied through the gas supply pipe connected to the gas introduction port of each of the chambers 100a through 100h. Hereinafter, the gas supply part connected to the gas introduction port 241 of the chamber 100a will be described. The descriptions of the gas supply parts (not shown) connected to the gas introduction ports of the chambers 100b, 100c, 100d, 100e, 100f, 100g and 100h are omitted since the gas supply parts (not shown) connected to the gas introduction ports of the chambers 100b, 100c, 100d, 100e, 100f, 100g and 100h are the same as the gas supply part connected to the gas introduction port 241 of the chamber 100a.

FIG. 4 schematically illustrates the configuration of the gas supply part such as the first gas supply part, the second gas supply part., and the purge gas supply part.

As shown in FIG. 4, a gas supply pipe aggregation unit 140a is connected to the gas supply pipe 150a. A first gas (first process gas) supply pipe 113a, a purge gas supply pipe 133a and a second gas (second process gas) supply pipe 123a are connected to the gas supply pipe aggregation unit 140a. Similarly, a gas supply pipe aggregation unit 140b is connected to the gas supply pipe 150b. A first gas (first process gas) supply pipe 113b, a purge gas supply pipe 133b and a second gas (second process gas) supply pipe 123b are connected to the gas supply pipe aggregation unit 140b.

<First Gas Supply Part>

The first gas supply part includes the first gas supply pipe 113a, an MFC 115a, and a valve 116a. The first gas supply pan may further include a first gas supply source 113 connected to the first gas supply pipe 113a. When the process gas source is liquid or solid, the first gas supply part may further include an evaporator 180.

<Second Gas Supply Part>

The second gas supply pan includes the second gas supply pipe 123a, an MFC 125a and a valve 126a. The second gas supply part may further include a second gas supply source 123 connected to the second gas supply pipe 123a. The second gas supply part may further include a remote plasma unit (RPU) 124. The remote plasma unit (RPU) 124 activates the second gas.

<Purge Gas Supply Part>

The purge gas supply part includes the purge gas supply pipe 133a, an MFC 135a and a valve 136a. The purge gas supply part may further include a purge gas supply source 133 connected to the purge gas supply pipe 133a.

<Controller>

As shown in FIG. 1 through FIG. 5, the substrate processing system 1000 or a substrate processing apparatus 105 includes a controller 260 configured to control the operation of components of the substrate processing system 1000 or the substrate processing apparatus 105.

Figure 6:
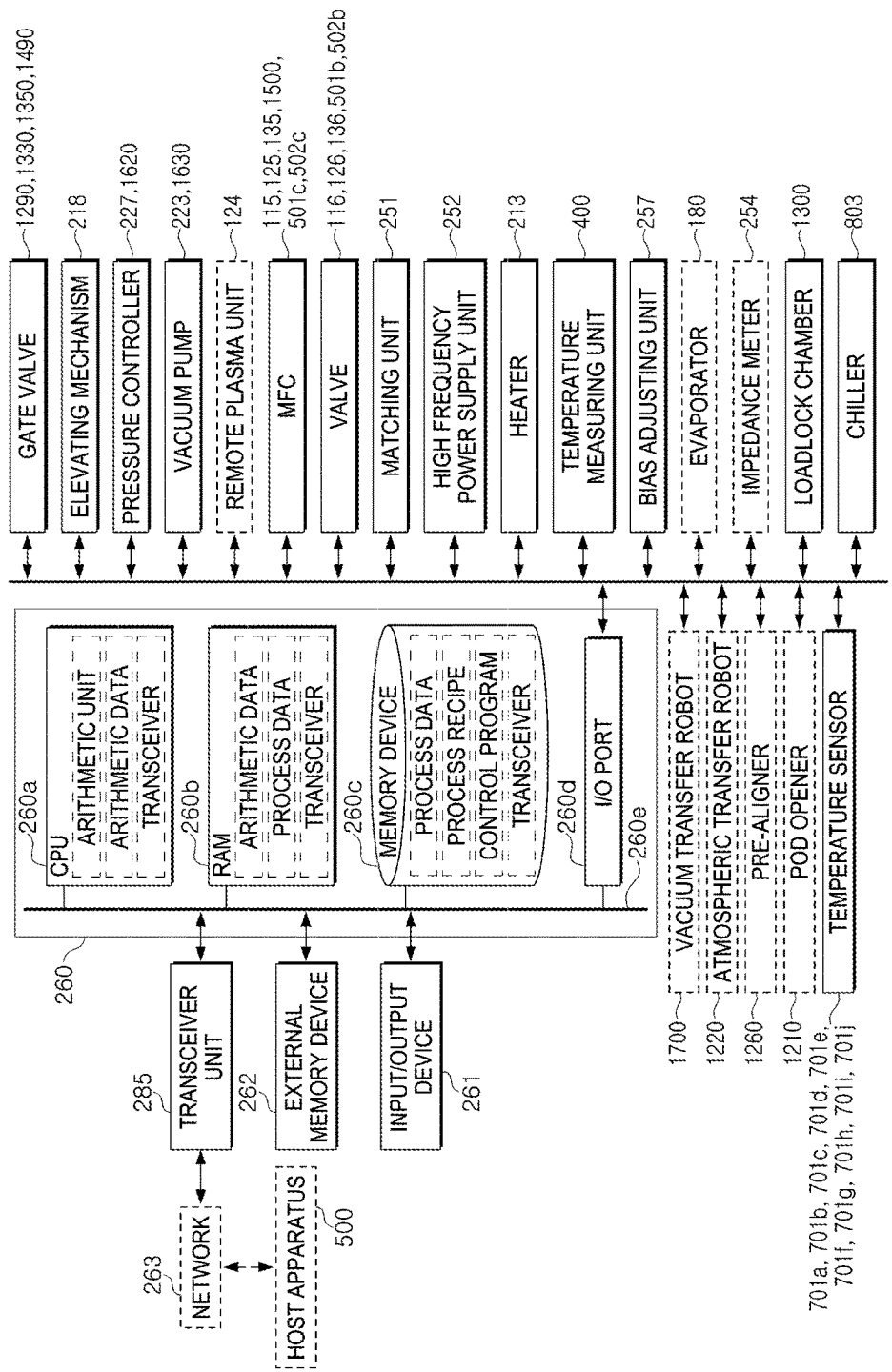
FIG. 6 schematically illustrates a controller according to the embodiment
Figure 7:
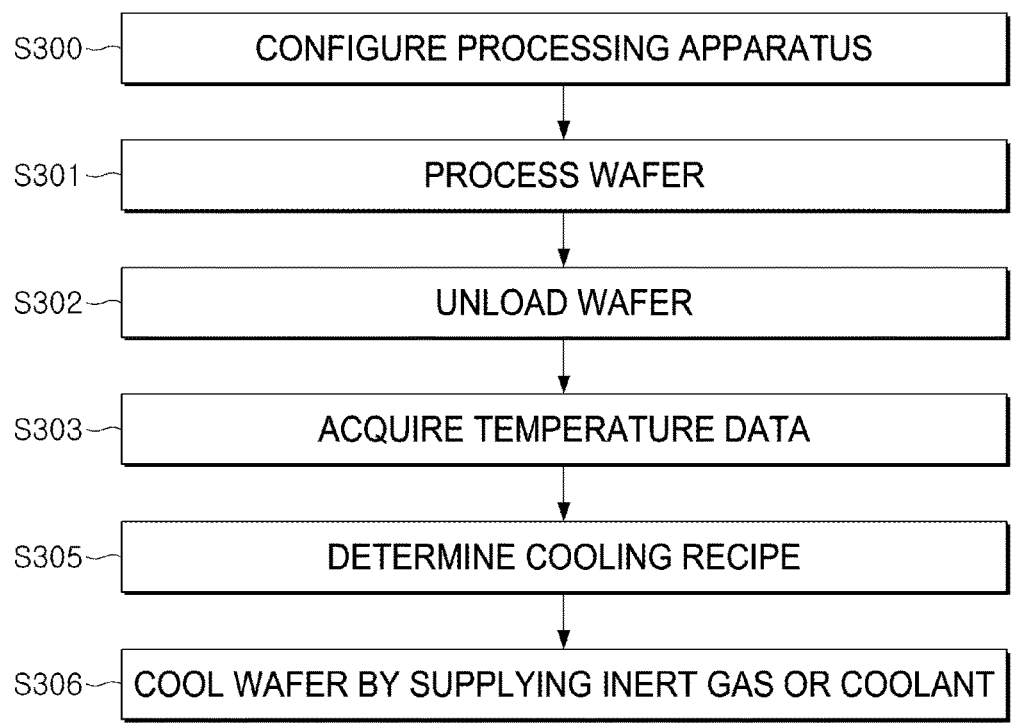
FIG. 7 illustrates a How of a method of manufacturing a semiconductor device according to the embodiment.

FIG. 6 schematically illustrates the configuration of the controller 260. The controller 260 which is a controller may be embodied by a computer including a central processing unit (CPU) 260a, a random access memory (RAM) 260b, a memory device 260c and an I/O port 260d. The RAM 260b, the memory device 260c, and the I/O port 260d may exchange data with the CPU 260a via an internal bus 260e. An input/output device 261 (for example, a touch panel), an external memory device 262, and a transceiver unit 285 maybe connected to the controller 260.

The memory device 260c is embodied by, for example, a flash memory or a hard disk drive (HDD). Data such as a control program tor controlling the operation of the substrate processing apparatus, a process recipe storing sequences and conditions of substrate processing and a table described later are readably stored in the memory device 260c. The process recipe, when executed by the controller 260, functions as a program for performing each step of the substrate processing described below to obtain a predetermined result. Hereinafter, the process recipe and the control program are collectively referred to simply as program. The term "program" may refer to only the process recipe, only the control program, or both. The RAM 260b is a memory area (work area) in which programs or data read by the CPU 260a is temporarily stored.

The I/O port 260d is connected to the gate valves 1290, 1330, 1350 and 1490, the elevating mechanism 218, the heater 213, the pressure controllers 227 and 1620, the vacuum pumps 223 and 1630, the matching unit 251, the high frequency power supply unit 252, the MFCs 115, 125, 135, 1530, 501c and 502c, the valves 116, 126, 136, 228, 1540, 501b and 502b, the RPU 124, the bias adjusting unit 257, the vacuum transfer robot 1700, the atmospheric transfer robot 1220 and the chiller 803. The I/O port 260d may be also connected to the components such as the impedance meter 254.

The CPU 260a reads and executes the control program from the memory device 260c and reads the process recipe from the memory device 260c in accordance with instruction such as an operation command inputted through the input/output device 261. The CPU 260a may compare the value received through the transceiver unit 285 with the process recipe or control data stored in the memory device 260c and compute the operation data. The CPU 260a may execute a process of determining the process data (process recipe) based on the operation data. The CPU 260a controls the opening and closing operations of the gate valve 1490, the elevating and lowering operations of the elevating mechanism 218, the power supply operation to the heater 213, the pressure adjustment operations of the pressure controllers 227 and 228, the ON/OFF control of the vacuum pump 223, the flow rate control operations of the MFCs 115, 125, 135, 145, 155, 501c and 502c, the gas activation operations of the RPUs 124, 144 and 154, the opening and closing operations of the valves 116, 126, 136, 237, 146, 156, 501b and 502b, the matching operation of the power of the matching unit 251, the power control operation of the high frequency power supply unit 252, operation of the bias adjusting unit 257, the matching operation of the matching unit 251 baaed on the data measured by the impedance meter 254, and the power control operation of the high frequency power supply unit 25 according to the process recipe. When the CPU 260a controls the components, the transceiver unit of the CPU 260a transmits control information to each component or receives control information from each component according to the contents of the process recipe.

The controller 260 is not limited to a dedicated computer. The controller 260 may be embodied by a general-purpose computer. The controller 260 according to the embodiment may be embodied by preparing the external memory device 262 (e.g., a magnetic disk such as a magnetic tape, a flexible disk and a hard disk, an optical disk such as a CD and a DVD, a magneto-optical disk such as MO, a semiconductor memory such as a USB memory and a memory card), and installing the program on the general-purpose computer using the external memory device 262. The method of providing the program to the computer is not limited to the external memory device 262. The program may be directly provided to the computer without using the external memory device 262 by a communication means such as the Internet and a dedicated line. The memory device 260c and the external memory device 262 are embodied by a computer-readable recording medium. Hereinafter, the memory device 260c and the external memory device 262 may be collectively referred to simply as a recording medium. As used herein, the term "recording medium" may refer to only the memory device 260c, only the external memory device 262, or both.

(2) Manufacturing Process of Semiconductor Device

Next the process of substrate processing will be described with reference to FIG. 7, FIG. 8A through FIG. 8C, FIG. 9A and FIG. 9B by exemplifying the process of forming an insulating film on a substrate which is one of semiconductor device manufacturing processes. In the exemplified substrate processing, a silicon nitride (SiN) film, which is a nitride film, is formed as an insulating film. The substrate processing is performed by the substrate processing system 1000 and the substrate processing apparatus 105 described above. In the following description, the controller 260 controls the operation of each component.

Hereinafter, the term "wafer" refers to "wafer itself" or "the wafer and the laminated structure of layers or films formed on the surface of the wafer". That is, the term "wafer" refers to "wafer including layers or films formed on the surface of the wafer". Hereinafter, the term "the surface of the wafer" refers to "exposed surface of the wafer itself" or "top surface of the laminated structure of layers or films." Hereinafter, the term "substrate" is substantially the same as the term "wafer." That is, the term "substrate" may be substituted by "wafer" and vice versa.

The substrate processing is described below.

<Processing Apparatus Configuration Step S300>

When substrate processing is performed in the chamber 100, e.g., chambers 100a and 100b, the controller 260 initially selects the process recipe to be executed. For example, the controller 260 stores the data recorded in the memory device 260c, in the RAM 260b, and configures the components via the I/O port 260d. The controller 260 may receive the process recipe from a host apparatus (upper device) 500 connected via the network 263. After the controller 260 configures the components, a substrate processing step S301 is performed.

<Substrate Processing Step S301>

In the substrate processing step S301, the controller 260 controls the first gas supply part to supply the first gas to the process chamber 201 and the exhaust part to exhaust the process chamber 201 while the wafer 200 is heated to a predetermined temperature according to the process recipe to process the wafer 200. The controller 260 may control the first gas supply part and the second gas supply part to simultaneously supply the first gas and the second gas to the processing space to perform a CVD process or simultaneously supply the first gas and the second gas to the processing space to perform a cyclic process. The controller 260 is configured to control the RPU 124 or the high frequency power supply unit 252 to supply RF power to the electrode 244 to generate plasma in the process chamber 201.

The cyclic process, which is one example of the substrate processing methods, is as follows. For example, dichlorosilane ($SiH_2Cl_2$, abbreviated as DCS) gas is used as the first gas and ammonia ($NH_3$) gas is used as the second gas. The DCS gas is supplied to the wafer 200 in the first step, and the $NH_3$ gas is supplied to the wafer 200 in the second step, $N_2$ gas is supplied and the inner atmosphere of the process chamber 201 is exhausted in the purge step between the first step and the second step. A silicon nitride film (SiN film) is formed on the wafer 200 by performing the cyclic process wherein the first step, the purge step and the second step are repeated.

<Substrate Unloading Step S302>

Figure 8A:
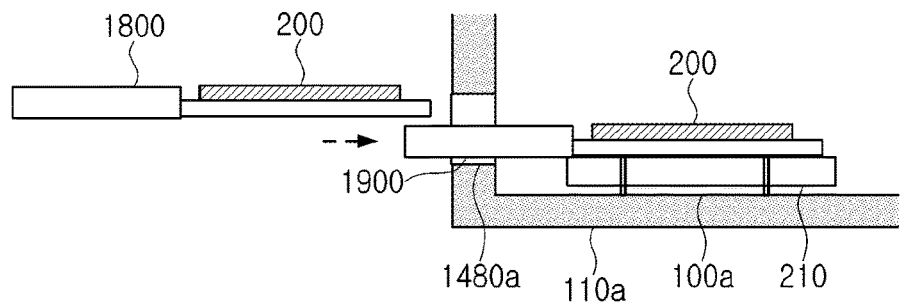
FIG. 8A through FIG. 8C illustrate swap & transfer process of a substrate according to the embodiment.
Figure 8B:
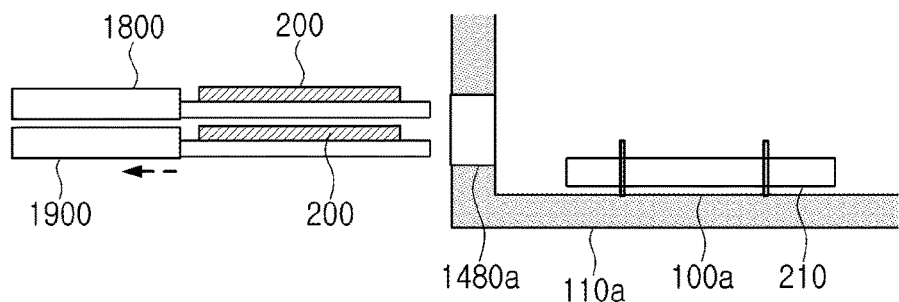
Figure 8C:
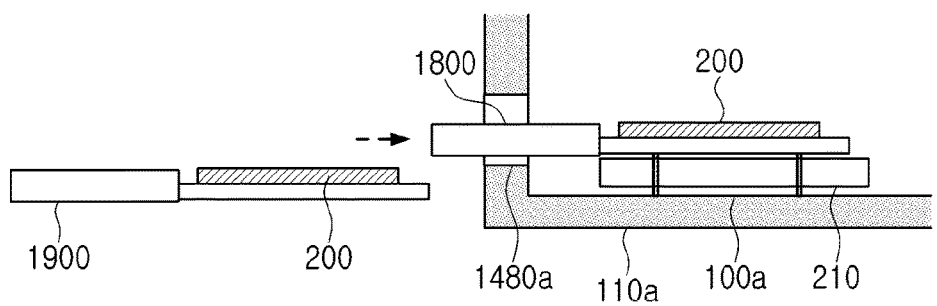
Figure 9A:
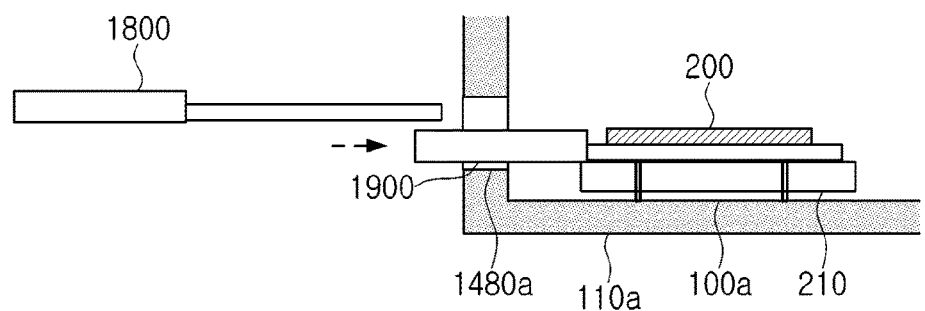
FIGS. 9A and 9B illustrate an example in which the swap & transfer process of the substrate according to the embodiment is not performed.
Figure 9B:
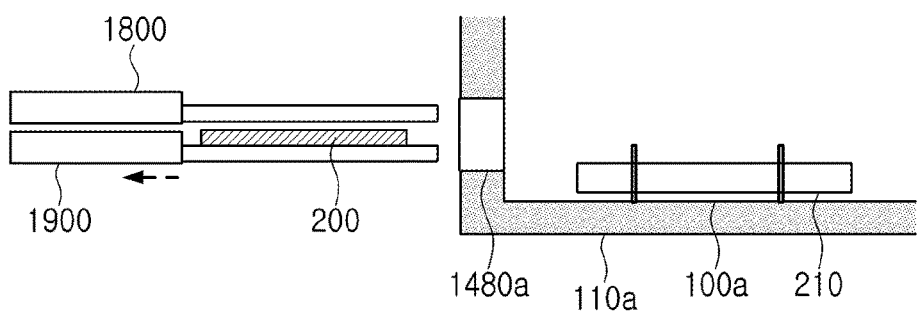

After the predetermined process is performed on the wafer 200, the processed wafer 200 is unloaded from the process chamber 201. The processed wafer 200 is unloaded from the process chamber 201 using the arm 1900 of the vacuum transfer robot 1700. When the swap & transfer process (first transport process) shown in FIGS. 8A through 8C is performed, an unprocessed wafer 300 is supported on and transferred by the arm 1800 of the vacuum transfer robot 1700 while unloading the processed wafer 200. When the pick & transfer process shown in FIGS. 9A and 9B is performed, the unprocessed wafer 200 is not transported by the arm 1800 while unloading the processed wafer 200.

The swap & transfer process will be described with reference to FIGS. 8A through 8C. The swap & transfer process is performed by the steps in the following. First, the waiter 200 is supported by lift pins 207 by moving the substrate support 210 to the transfer position shown in dashed lines in FIG. 5. By opening the GV 1490, the transfer chamber 203 is in communication with the TM 1400. After the transfer chamber 203 and the TM 1400 are in communication, the arm 1900 is inserted into the transfer chamber 203 and the processed wafer 200 is placed on the arm 1900 as shown in FIG. 8A. After the processed wafer 200 is placed on the arm 1900, the arm 1900 is moved to the TM 1400 as shown in FIG. 8B. After the arm 1900 is moved back to the TM 1400, the elevator 1450 descends the arm 1800. The arm 1800 is inserted into the transfer chamber 203 and then the unprocessed wafer 200 is placed on the lift pins 207 as shown in FIG. 8C. The processed wafer 200 may be in standby on the arm 1900 while the unprocessed wafer 200 is transported on the arm 1800 in the swap & transfer process. During the waiting period of the processed wafer 200, the temperature of the processed wafer 200 may be lowered by the heat being conducted from the processed wafer 200 placed on the arm 1900 to the arm 1900 or by heat being radiated to the unprocessed wafer 200 supported on the arm 1800.

The pick & transfer process will be described below with reference to FIGS. 9A and 9B. As shown in FIG. 9A, the arm 1900 is inserted into the transfer chamber 205 and the processed wafer 200 is placed on the arm 1900. As shown in FIG. 9B, arm 1900 is moved to TM 1400. During the pick & transfer process, there is no waiting period since the vacuum transfer robot 1700 immediately returns the processed wafer 200 from the TM 1400 to the loadlock chamber 1300. Thus, when the processed wafer 200 is transported by the pick & transfer process, the temperature drop of the wafer 200 is less than that of the wafer 200 when transported by the swap & transfer process. Thus, according to the pick & transfer process, the processed wafer 200 is returned to the loadlock chamber 1300 while the temperature of the processed wafer 200 is substantially maintained.

The temperatures of the processed wafers 200 transferred to the loadlock chamber 1300 vary depending on the mode of transportation, i.e., on which of the swap & transfer process and the pick & transfer process is used. According to a study performed by the inventors of the present invention, it was confirmed that the temperature of the processed wafers 200 ranges from 100° C. to 200° C.

<Temperature Data Acquiring Step S303>

During the transfer of the processed wafer 200 from the transfer chamber 203 to the loadlock chamber 1300, a temperature data acquiring step S303 is performed. For example, the temperature data is obtained by the following process.

(a) The temperature data of the wafer 200 corresponding to the temperature of the wafer 200 in the substrate processing step S301 is read from the memory device 260c.

(b) The temperature of the wafer 200 is obtained by measuring the temperature of the wafer 200 using at least one of the temperature sensors 701a, 701b, 701c, 701d, 701e, 701f, 701g, 701h, 701i and 701j. Preferably, the temperature of the wafer 200 is measured by at least one of the temperature sensors 701i and 701j provided in front of the loadlock chamber 1300. The temperature of the wafer 200 immediately before being transferred to the loadlock chamber 1300 may be measured by using the temperature sensor 701i and/or 701j. The cooling recipe suitable for the wafer 200 is determined and selected in cooling recipe determination step S305 according to the measured temperature.

<Cooling Recipe Determination Step S305>

In the cooling recipe determination step S305, the cooling recipe of the processed wafer 200 is determined and selected based on the temperature obtained in the temperature data acquiring step S303. That is, the cooling recipe to be executed is determined and selected according to the temperature range of the wafer 200

As shown in FIG. 10, in the cooling recipe determination step S305, recipes A1 through A5 are read from the cooling recipe table stored in the memory device 260c according to the temperature of the wafer 200 to determine the flow rate of the inert gas supplied to the loadlock chamber 1300 or the flow rate of the coolant supplied to the cooling channels 802a and 802b. FIG. 10 illustrates a table of the temperatures of the wafer 20 and corresponding cooling recipes. Referring to FIG. 10, when the temperature of the wafer 200 is room temperature (RT), the recipe A1 (first cooling recipe) is read and executed. When the temperature of the wafer 200 is 200° C. or lower, the recipe A2 (second cooling recipe) is read and executed. When the temperature of the wafer 200 is 300° C. or lower, the recipe A3 (third cooling recipe) is read and executed. When the temperature of the wafer 200 is 400° C. or lower, the recipe A4 (fourth cooling recipe) is read and executed. When the temperature of the wafer 200 is 500° C. or lower, recipe A5 (fifth cooling recipe) is read and executed. The temperature of the wafer 200 shown in FIG. 10 is exemplary, and the temperature range of the wafer 200 may be changed appropriately.

After determining the cooling recipe, the configuration data of the configuration data table shown in FIG. 11 is read from the memory device 260c. The configuration, data table stores, for each of the cooling recipes A1 through A5, whether the swap & transfer process is performed (b1 to b9), the flow rates of the inert gas supplied to the load lock chamber 1300 (c1 to c9) and the flow rate of the coolant supplied to the cooling channels 802a and 802b (z1 to z9). As shown in FIG. 11, the higher the temperature of the wafer 200, the larger the flow rate of the inert gas or the larger the flow rate of the coolant. The flow rate of the inert gas or the flow rate of the coolant may also be changed depending on whether the swap & transfer process is performed. As a result, the time necessary for cooling the wafer 200 may be shortened. Specifically, when the cooling recipe A1 is read and the swap & transfer process has performed, the flow rate of the inert gas is set to 50 and the flow rate of the coolant is set to 1 according to the configuration data table shown in FIG. 11, and the components of the substrate processing apparatus operate accordingly.

<Cooling Step S306>

The controller 260c is configured to control the components of the substrate processing apparatus to supply the inert gas into the loadlock chamber 1300 at a predetermined flow rate and supply the coolant from the chiller 803 to the cooling channels 802a and 802b at a predetermined flow rate to cool the processed wafer 200 based on the cooling recipe read in the cooling step S306. The supply of coolant to the cooling channels 802a and 802b may be initiated when the processed wafer 200 is placed on the second support parts 1311c and 1311d. The cooling parts 801a and 801b may be pre-cooled by the supply of the coolant to the cooling channels 802a and 802b before wafer 200 is placed. The pre-cooling of the cooling parts 801a and 801b prevents the temperature of the cooling parts 801a and 801b from rising even when the cooling parts 801a and 801b cool the processed wafers 200 is. Preferably, the flow rate of the coolant supplied to the cooling channels 802a and 802b may be increased after $n^{th}$ wafer 200 processed at a first temperature is cooled but before $(n+1)^{th}$ wafer 200 processed at a second temperature is transferred (where n is a natural number, and the first temperature is lower than the second temperature). By cooling the cooling pans 801a and 801b in this way, it is possible to reduce the time taken for the wafer 200 to cool down.

While the technique is described by way of the above-described embodiment, she above-described technique is not limited thereto The above-described technique may be modified in various ways without departing from the scope of the present invention.

In the above-described embodiment, while the method of forming the film by alternately supplying the first gas and the second gas is described, the above-described technique may be applied to other film forming methods. The above-described technique may also be applied, for example, when a time period for supplying the first gas and the second gas are overlapped.

In the above-described embodiment, the wafer is processed by supplying two gases. However, the above-described technique may be applied to processing of a wafer using a single gas.

While the above-described embodiment is described based on a film-forming process, the above-described technique may be applied to other processes. The above-described technique may also be applied to processes such as diffusion process using plasma, oxidation process, nitridation process, oxynitridation process, reduction process, oxidation-reduction process, etching process and thermal process. The above-described technique may also be applied, for example, to plasma oxidation or plasma nitridation of a film formed on a substrate surface or on substrate using only reaction gas. The above-described technique may also be applied to plasma annealing process using only reaction gas.

While the above-described embodiment is described by exemplifying a case where the above-described technique is applied to a manufacturing process of a semiconductor device, the above-described technique may be applied to other processes as well as a manufacturing process of a semiconductor device. The above-described technique may be applied to substrate processing such as a manufacturing process of a liquid crystal device, a manufacturing process of a solar cell, a manufacturing process of a light emitting device, a processing of a glass substrate, a processing of a ceramic substrate and a processing of a conductive substrate.

While the above-described embodiment is described based on an example in which a silicon-containing gas is used as a source gas and a nitrogen-containing gas as a reaction gas to form a silicon nitride film, the above-described technique may also be applied to the formations of other films. For example, the above-described technique may be applied to the formations of a film containing oxygen, a film containing nitrogen, a film containing carbon, a film containing boron, a film containing metal and a film containing a plurality of these elements. The above-described technique may also be applied to the formations of films such as AlO film, ZrO film, HfO film, HfAlO film, ZrAlO film, SiC film, SiCN film. SiBN film, TiN film, TiC film and TiAlC film.

While the above-described embodiment is described based on an apparatus configured to process one substrate in one process chamber, the above-described technique is not limited thereto. The above-described technique may also be applied to an apparatus configured to process a plurality of substrates arranged in horizontal direction or vertical direction.

According to the technique described herein, the processing uniformity of a plurality of substrates may be improved.

What is claimed is:

1. A method of manufacturing a semiconductor device, comprising:
   (a) subjecting a substrate accommodated in one of a plurality of process chambers to a thermal process;
   (b) transferring the substrate processed in (a) by a transfer robot provided in a vacuum transfer chamber connected to the plurality of process chambers from the one of a plurality of process chambers to a loadlock chamber connected to the vacuum transfer chamber;
   (c) measuring a temperature of the substrate processed in (a) by a temperature sensor provided at one side of a gate valve provided between the vacuum transfer chamber and the one of the plurality of process chambers; and
   (d) cooling the substrate accommodated in the loadlock chamber by reading a table of flow rates stored in a memory device and selecting a flow rate of an inert gas from the table of flow rates based on the temperature measured in (c) and supplying the inert gas to the substrate accommodated in the loadlock chamber at the selected flow rate.

2. The method of claim 1, wherein the flow rate of the inert gas selected in (d) for a first type of transfer process differ from the flow rate of the inert gas selected in (d) for a second type of transfer process, the first type of transfer process comprising: transferring the substrate processed in (a) out of the one of the plurality of process chambers by a first arm of the transfer robot; and transferring the substrate processed in (a) to the loadlock chamber after transferring an unprocessed substrate into the one of the plurality of process chambers by a second arm of the transfer robot, and the second type of transfer process comprising: transferring the substrate processed in (a) out of the one of the plurality of process chambers by the first arm; and transferring the substrate processed in (a) to the loadlock chamber without transferring the unprocessed substrate into the one of the plurality of process chambers by the second arm.

3. The method of claim 2, wherein the inert gas is supplied at a first flow rate for the first type of transfer process and at a second flow rate higher than the first flow rate for the second type of transfer process.

4. The method of claim 3, further comprising:
   (e) cooling the substrate accommodated in the loadlock chamber by reading the table of flow rates stored in the memory device and selecting a flow rate of a coolant from the table of flow rates based on the temperature measured in (c), and supplying the coolant to a cooling part provided in the loadlock chamber and facing the substrate.

5. The method of claim 2, further comprising:
(e) cooling the substrate accommodated in the loadlock chamber by reading the table of flow rates stored in the memory device and selecting a flow rate of a coolant from the table of flow rates based on the temperature measured in (c), and supplying the coolant to a cooling part provided in the loadlock chamber and facing the substrate.

6. The method of claim 1, further comprising:
(e) cooling the substrate accommodated in the loadlock chamber by reading the table of flow rates stored in the memory device and selecting a flow rate of a coolant from the table of flow rates based on the temperature measured in (c), and supplying the coolant to a cooling part provided in the loadlock chamber and facing the substrate.

7. The method of claim 1, wherein the flow rate of the inert gas selected in (d) for a first type of transfer process differ from the flow rate of the inert gas selected in (d) for a second type of transfer process, the first type of transfer process comprising: transferring the substrate processed in (a) out of the one of the plurality of process chambers by a first arm of the transfer robot; and transferring the substrate processed in (a) to the loadlock chamber after transferring an unprocessed substrate into the one of the plurality of process chambers by a second arm of the transfer robot, and the second type of transfer process comprising: transferring the substrate processed in (a) out of the one of the plurality of process chambers by the first arm; and transferring the substrate processed in (a) to the loadlock chamber without transferring the unprocessed substrate into the one of the plurality of process chambers by the second arm.

8. The method of claim 7, wherein the inert gas is supplied at a first flow rate for the first type of transfer process and at a second flow rate higher than the first flow rate for the second type of transfer process.

9. The method of claim 8, further comprising:
(e) cooling the substrate accommodated in the loadlock chamber by reading the table of flow rates stored in the memory device and selecting a flow rate of a coolant from the table of flow rates based on the temperature measured in (c), and supplying the coolant to a cooling part provided in the loadlock chamber and facing the substrate.

10. The method of claim 7, further comprising:
(e) cooling the substrate accommodated in the loadlock chamber by reading the table of flow rates stored in the memory device and selecting a flow rate of a coolant from the table of flow rates based on the temperature measured in (c), and supplying the coolant to a cooling part provided in the loadlock chamber and facing the substrate.

* * * * *